United States Patent [19]
Laskaris et al.

[11] Patent Number: 5,442,928
[45] Date of Patent: Aug. 22, 1995

[54] HYBRID COOLING SYSTEM FOR A SUPERCONDUCTING MAGNET

[75] Inventors: Evangelos T. Laskaris, Schenectady; Bizhan Dorri, Clifton Park, both of N.Y.

[73] Assignee: General Electric, Schenectady, N.Y.

[21] Appl. No.: 286,368

[22] Filed: Aug. 5, 1994

[51] Int. Cl.⁶ .............................................. F25B 19/00
[52] U.S. Cl. .................................... 62/51.1; 505/892
[58] Field of Search ......................... 62/51.1; 505/892

[56] References Cited

U.S. PATENT DOCUMENTS

| | | | |
|---|---|---|---|
| 3,358,472 | 12/1967 | Klipping | 62/51.1 |
| 4,782,671 | 11/1988 | Breneman et al. | |
| 4,796,433 | 1/1989 | Bartlett | 62/51.1 |
| 4,986,078 | 1/1991 | Laskaris | |
| 5,111,665 | 5/1992 | Ackermann | |
| 5,222,366 | 6/1993 | Herd et al. | 62/51.1 |
| 5,293,752 | 3/1994 | Nagao et al. | |
| 5,379,600 | 1/1995 | Moritsu et al. | 62/51.1 |

FOREIGN PATENT DOCUMENTS 2423301 2/1975 Germany .
2233750 1/1991 United Kingdom .

Primary Examiner—Ronald C. Capossela
Attorney, Agent, or Firm—Douglas E. Erickson; Paul R. Webb, II

[57] ABSTRACT

A cooling system for a superconductive magnet. A dewar, located outside the magnet, includes a vacuum jacket hermetically connected to the magnet's vacuum enclosure and includes liquid helium located within the vacuum jacket. A thermal busbar is located within and spaced apart from the hermetically connected vacuum jacket and vacuum enclosure. The thermal busbar has a first end located within the vacuum jacket and a second end located within the vacuum enclosure and in thermal contact with the magnet's superconductive coil. A cryocooler coldhead, located outside the vacuum enclosure, has a housing located outside the vacuum jacket and has a cold stage extending from the housing to inside the vacuum jacket to re-liquefy any helium boiled-off in cooling the magnet 10.

11 Claims, 1 Drawing Sheet

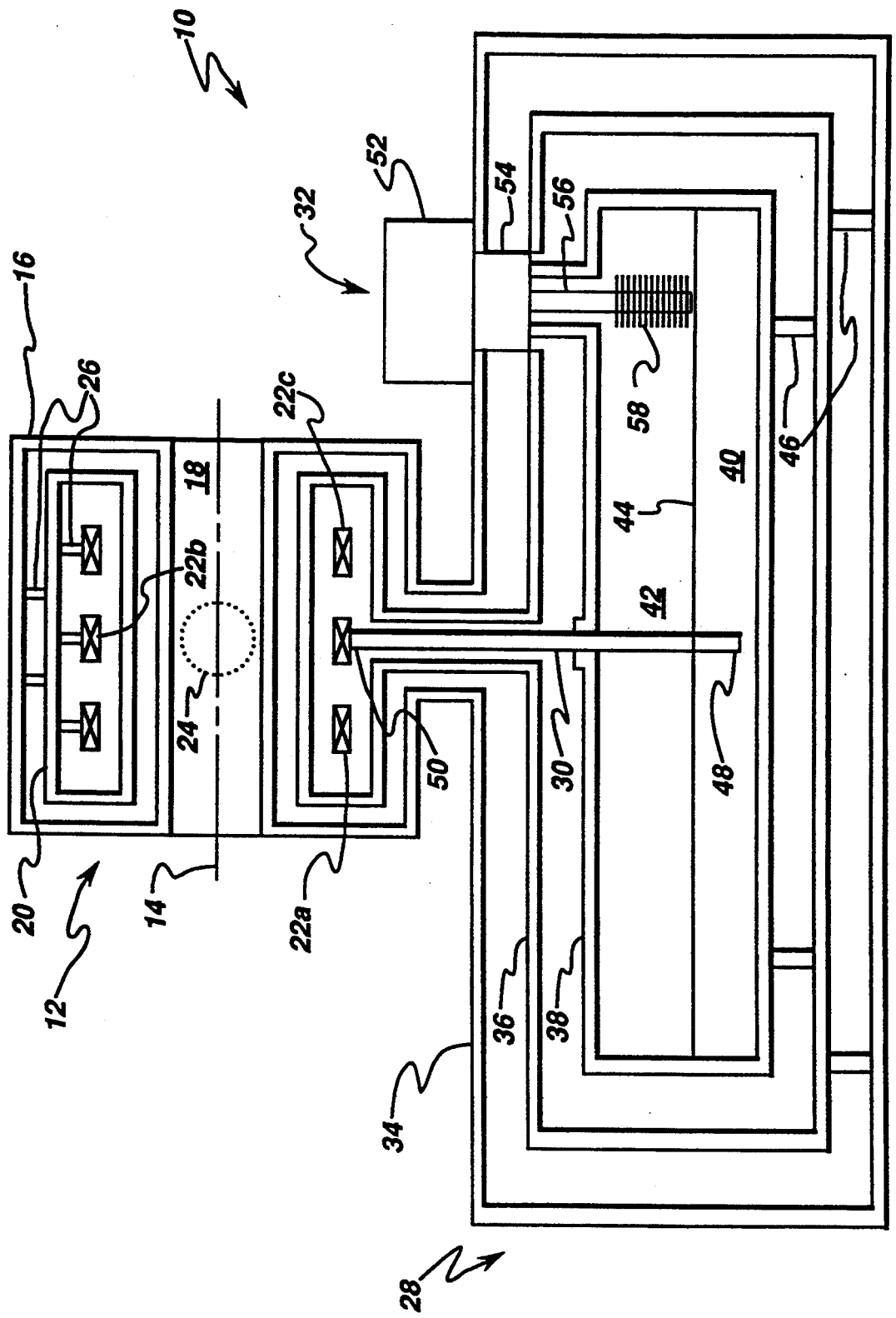

HYBRID COOLING SYSTEM FOR A SUPERCONDUCTING MAGNET

BACKGROUND OF THE INVENTION

The present invention relates generally to a superconducting magnet and more particularly to a cooling system for such a magnet.

Superconducting magnets may be used for various purposes, such as to generate a uniform magnetic field as part of a magnetic resonance imaging (MRI) diagnostic system. MRI systems employing closed or open superconductive magnets are used in various fields such as medical diagnostics. Open magnets typically employ two spaced-apart toroidal-shaped superconducting coil assemblies, while closed magnets typically employ a single solenoidal-shaped superconducting coil assembly. The superconducting coil assembly includes one or more superconductive coils which are wound from superconductive wire.

Some superconductive magnets are cooled by a cryocooler coldhead (such as that of a conventional Gifford-McMahon cryocooler) which is mounted to the magnet. If there is an electric power outage or if the cryocooler otherwise malfunctions (or even has its performance degrade over time), the superconducting magnet will heat up and quench (i.e., lose its superconductivity). Also, although conventional cryocoolers can achieve low temperatures in the range of 3.5 to 4.0 Kelvin, their cooling capacity is modest, and a typical cryocooler-cooled MRI superconductive magnet may take up to a week or so to reach superconductive temperatures during start-up or during recovery from a quench. Other superconductive magnets are cooled by liquid helium placed inside the magnet, with such liquid helium boiling off as gaseous helium during magnet cooling and with such gaseous helium typically escaping from the magnet to the atmosphere. Such placement of the liquid helium inside the magnet is incompatible with compact magnet designs. What is needed is an improved cooling system for a superconductive magnet. Further, the cooling system must be compatible with compact superconductive magnet designs.

SUMMARY OF THE INVENTION

It is an object of the invention to provide a cooling system for a superconductive magnet.

The cooling system of the invention is for a superconductive magnet having a vacuum enclosure and having a superconductive coil located within and spaced apart from the vacuum enclosure. The cooling system includes a dewar and a thermal busbar. The dewar is located outside the vacuum enclosure, has a vacuum jacket generally hermetically connected to the vacuum enclosure, and has liquid helium located within the vacuum jacket. The thermal busbar is located within and spaced apart from the generally hermetically connected vacuum jacket and vacuum enclosure, has a first end located within the vacuum jacket, and has a second end located within the vacuum enclosure and in thermal contact with the superconductive coil.

In a preferred embodiment, the cooling system also includes a cryocooler coldhead located outside the vacuum enclosure, with the cryocooler coldhead having a housing located outside the vacuum jacket and having a stage extending from the housing to inside the vacuum jacket.

Several benefits and advantages are derived from the invention. The thermal busbar cools the superconductive coil with the thermal busbar being cooled by liquid helium located outside the magnet which allows for a compact magnet design while providing for high cooling capacity and while providing for magnet cooling for an extended period of time without electric power. The cryocooler coldhead is located outside the vacuum enclosure for compact magnet design and has a stage extending into the vacuum jacket of the dewar to recondense boiled-off gaseous helium to liquid helium eliminating the conventional need to re-supply liquid-helium-cooled magnets with liquid helium.

BRIEF DESCRIPTION OF THE DRAWINGS

The accompanying drawing illustrates a preferred embodiment of the present invention wherein:

the FIGURE is a schematic cross-sectional side-elevational view of a preferred embodiment of the superconductive magnet of the invention.

DETAILED DESCRIPTION OF THE INVENTION

Referring now to the drawing, the FIGURE shows the cooling system 10 of the present invention. The cooling system 10 is for a superconductive magnet 12. In a preferred embodiment, the superconductive magnet 12 is a magnetic resonance imaging (MRI) superconductive magnet 12 and includes a generally longitudinally extending axis 14, a generally annularly cylindrical shaped vacuum enclosure 16 having a generally cylindrical shaped bore 18, a thermal shield 20 disposed within and spaced apart from the vacuum enclosure 16, and a plurality of longitudinally spaced apart superconductive coils 22a to 22c disposed within and spaced apart from the thermal shield 20 of the magnet 12. The superconductive coils 22a to 22c are designed to generate a high magnetic field having a low magnetic field inhomogeneity within an MRI imaging volume 24 (shown in dotted line) in the bore 18. The superconductive coils 22a to 22c, the thermal shield 20, and the vacuum enclosure 16 are generally coaxially aligned with the axis 14, and the imaging volume 24 preferably has a shape of a sphere having a center disposed on the axis 14. In an exemplary embodiment, thermally insulative spacers 26 support the thermal shield 20 from the vacuum enclosure 16 and support the superconductive coils 22a to 22c from the thermal shield 20. A coil form (not shown in the FIGURE) may be employed to support the superconductive coils 22a to 22c, or such superconductive coils 22a to 22c may be free standing and surrounded by a ring (not shown in the FIGURE), such as an aluminum ring, for magnetic force containment. It is noted that it can be said that the magnet 12 has superconductive coils 22a to 22c disposed within and spaced apart from the vacuum enclosure 16.

In a first preferred construction, the coil form (not shown in the FIGURE) comprises a glass reinforced epoxy composite wrapped with copper (or some other high thermal conductivity material), the thermal shield 20 comprises copper (or some other high thermal conductivity material), and the vacuum enclosure 16 comprises a metal such as stainless steel. In a second preferred construction, the coil form (not shown in the FIGURE) and the thermal shield 20 each comprise a glass reinforced epoxy composite having copper (or some other high thermal conductivity material) wires or strips, and the vacuum enclosure 16 comprises a glass reinforced epoxy composite having some vapor barrier structure (such as stainless steel foils) embedded in it. In a third preferred construction, the vacuum enclosure 16 comprises iron or any other magnetically shielding material to provide partial or complete shielding of the magnet's stray field. Such shielding makes the magnet 12 easier to site in a hospital room containing electronic equipment whose proper operation would be compromised by the magnet's stray field. Preferably, the superconductive coils 22a to 22c comprise a continuous (integral or spliced) length of Nb—Ti superconductive wire operating at a temperature of generally 4 Kelvin, and the thermally insulative spacers 26 comprise radial filamentary carbon graphite tubes. It is noted that liquid helium has a temperature of generally 4 Kelvin.

The cooling system 10 includes a dewar 28, a thermal busbar 30, and preferably a cryocooler coldhead 32. The dewar 28 is disposed outside the vacuum enclosure 16 of the magnet 12. The dewar 28 has a vacuum jacket 34 generally hermetically connected to the vacuum enclosure 16 of the magnet 12. Preferably, the vacuum jacket 34 of the dewar 28 is in general vacuum communication with the vacuum enclosure 16 of the magnet 12. The dewar 28 also has a thermal shield 36 disposed within and spaced apart from the vacuum jacket 34. The thermal shield 36 of the dewar 28 is thermally connected to the thermal shield 20 of the magnet 12. The dewar 28 additionally has a helium reservoir 38 disposed generally within and spaced apart from the thermal shield 36 of the dewar 28. The helium reservoir 38 contains liquid helium 40 and also contains gaseous helium 42 disposed on top of the liquid helium 40 such that the gaseous helium 42 generally contacts the liquid helium 40 along an interface 44. In an exemplary embodiment, thermally insulative spacers 46 support the thermal shield 36 from the vacuum jacket 34 and support the helium reservoir 38 from the thermal shield 36. It is noted that it can be said that the dewar 28 has liquid helium 40 disposed within the vacuum jacket 34, that the dewar 28 has liquid helium 40 disposed within the thermal shield 36, or that the dewar 28 has gaseous helium 42 disposed within the vacuum jacket 34 on top of the liquid helium 40. In a preferred construction, the vacuum jacket 34 comprises stainless steel, the thermal shield 36 comprises aluminum, the helium reservoir 38 comprises stainless steel, and the thermally insulative spacers 46 comprise fiber reinforced composites.

The thermal busbar 30 of the cooling system 10 is disposed within and spaced apart from the thermally connected thermal shield 36 of the dewar 28 and thermal shield 20 of the magnet 12. It is noted that it can be said that the thermal busbar 30 is disposed within and spaced apart from the generally hermetically connected vacuum jacket 34 and vacuum enclosure 16. The thermal busbar 30 has a first end 48 and a second end 50. The first end 48 of the thermal busbar 30 is disposed within the liquid helium 40 (and hence is disposed within the helium reservoir 38). It is noted that it can be said that the first end 48 is disposed within the vacuum jacket 34 of the dewar 28. The second end 50 of the thermal busbar 30 is disposed within the thermal shield 20 of the magnet 12. It is noted that it can be said that the second end 50 is disposed within the vacuum enclosure 16 of the magnet 12. The second end 50 of the thermal busbar 30 is in thermal contact with the superconductive coils 22a to 22c by being in thermal contact with superconductive coil 22b and by superconductive coils 22a and 22c being in thermal contact with superconductive coil 22b such as through the previously-mentioned (but not shown in the FIGURE) coil form or surrounding ring. The thermal busbar 30 is hermetically connected to the helium reservoir 38. From the FIGURE it is seen that the hermetic connection to the helium reservoir 38 is made by the thermal busbar 30 between its first and second ends 48 and 50. Preferably, the thermal busbar 30 comprises copper.

The cryocooler coldhead 32 of the cooling system 10 is disposed outside the vacuum enclosure 16 of the magnet 12. The cryocooler coldhead 32 has a housing 52 disposed outside the vacuum jacket 34 of the dewar 28, a first stage 54 extending from the housing 52 to the thermal shield 36 of the dewar 28, and a second stage 56 extending into the helium reservoir 38. It is noted that it can be said that the second stage 56 extends from the first stage 54 to inside the thermal shield 36 of the dewar 28, and that the cryocooler coldhead 32 has a stage (i.e., the first stage 54) which extends from the housing 52 to inside the vacuum jacket 34 of the dewar 28. For Nb—Ti superconductive coils, the first stage 54 of the cryocooler coldhead 32 would be maintained at a temperature of generally 40 Kelvin, and the second stage 56 of the cryocooler coldhead 32 would be maintained at a temperature of generally 4 Kelvin.

In a preferred embodiment, the cooling system 10 additionally includes a re-condensing coil 58 attached to the second stage 56 of the cryocooler coldhead 32. Preferably, the re-condensing coil 58 extends generally downward from the second stage 56 of the cryocooler coldhead 32 to a point which is above and proximate the interface 44 of the gaseous helium 42 and the liquid helium 40.

In operation, the cooling system 10 of the invention preferably would have the helium reservoir 38 initially charged with liquid helium 40 and gaseous helium 42 wherein that the interface 44 would be at a predetermined level such that the re-condensing coil 58 extends downward to a point which is above and proximate the interface 44. With the cryocooler coldhead 32 operating and the thermal busbar 30 having its first end 48 disposed within the liquid helium 40 and having its second end 50 in thermal contact with the superconductive coil 22b, the superconductive coils 22a to 22c are quickly (in a matter of hours) cooled to their cryogenic critical temperature permitting and maintaining superconducting operation of the magnet 12. As some of the liquid helium 40 boils off in the cooling process, the re-condensing coil 58 will re-liquefy the boiled-off helium, thus eliminating the need to re-supply the cooling system 10 with liquid helium 40. It is noted that the cooling system 10 overall achieves no helium boil-off during magnet operation. Should the cryocooler coldhead 32 lose electric power, malfunction, or have its cooling capability degrade over time, the helium reservoir 38 will permit superconducting operation of the magnet 12 for weeks at a time, thus allowing plenty of time to restore proper cryocooler operation.

Applicants designed (but have yet to build) a particular cooling system based on the above-described cooling system 10 of the invention for a compact superconductive magnet generally similar to magnet 12. The cooling system was designed for a Nb—Ti magnet having a generally 4.0 Tesla magnetic field in a generally 18 centimeter-diameter spherical imaging volume, a longitudinal length of generally 86 centimeters, a maximum radial diameter of generally 74 centimeters, and a minimum bore diameter of generally 38 centimeters. The cryocooler coldhead chosen for the design was that of a rare-earth, Gifford-McMahon type cryocooler having a first stage temperature of generally 40 Kelvin and a second stage temperature of generally 4 Kelvin. The helium reservoir was designed to hold generally 200 liters of liquid helium and generally 100 liters of gaseous helium and had a shape of generally a squat upright cylinder with a curved top and bottom and with dimensions of generally 120 centimeters in diameter and generally 70 centimeters in maximum height. Analysis showed the cooling system allowed a more compact magnet design, allowed faster cooling, and allowed a longer thermal hold time compared to conventional cooling systems for superconductive magnets. The thermal hold time of a superconducting magnet is the period of time from cryocooler failure to quench and is generally limited by the thermal mass of the magnet. It is noted that the thermal hold time of conventional, cryocooler-cooled, superconducting magnets is not long enough to wait out a lengthy power failure of several hours without quenching. If a substantial solid thermal mass (such as a lead thermal ballast) is added to the magnet, the weight and volume of this added mass can pose problems due to space and structural support limitations. Also, the design of conventional superconducting magnets does not allow replacement of the cryocooler, in single-cryocooler systems, without quenching.

The foregoing description of several preferred embodiments of the invention has been presented for purposes of illustration. It is not intended to be exhaustive or to limit the invention to the precise form disclosed, and obviously many modifications and variations are possible in light of the above teaching. For example, the superconductive magnet 12 need not be an MRI superconductive magnet and need not have a generally cylindrical shape. The hermetic connection of the vacuum enclosure 16 of the magnet 12 and the vacuum jacket 34 of the dewar 28, the thermal connection of the thermal shield 20 of the magnet 12 and the thermal shield 36 of the dewar 28, and the thermal contact of the second end 50 of the thermal busbar 30 with the superconductive coil 22b may be ones allowing for ease of attachment and detachment. It is noted that the terminology "thermal contact" includes direct structural contact as well as indirect structural contact. It is further noted that not all superconducting magnets may have a thermal shield. It is intended that the scope of the invention be defined by the claims appended hereto.

We claim:

1. A cooling system for a superconductive magnet, said magnet having a vacuum enclosure and having a superconductive coil disposed within and spaced apart from said vacuum enclosure, and said cooling system comprising:
   a) a dewar disposed outside said vacuum enclosure, said dewar having a vacuum jacket generally hermetically connected to said vacuum enclosure and having liquid helium disposed within said vacuum jacket; and
   b) a thermal busbar disposed within and spaced apart from said generally hermetically connected vacuum jacket and vacuum enclosure, having a first end disposed within said vacuum jacket, and having a second end disposed within said vacuum enclosure and in solid-conduction-only thermal contact with said superconductive coil.

2. The cooling system of claim 1, wherein said dewar also has gaseous helium disposed within said vacuum jacket on top of said liquid helium, and wherein said first end of said thermal busbar is disposed within said liquid helium.

3. The cooling system of claim 1, also including:
   c) a cryocooler coldhead disposed outside said vacuum enclosure, said cryocooler coldhead having a housing disposed outside said vacuum jacket and having a stage extending from said housing to inside said vacuum jacket.

4. The cooling system of claim 1, wherein said dewar also includes a thermal shield disposed within and spaced apart from said vacuum jacket, and wherein said liquid helium is disposed within said thermal shield of said dewar.

5. The cooling system of claim 4, also including:
   c) a cryocooler coldhead disposed outside said vacuum enclosure, said cryocooler coldhead having a housing disposed outside said vacuum jacket, having a first stage extending from said housing to said thermal shield of said dewar, and having a second stage extending from said first stage to inside said thermal shield of said dewar.

6. The cooling system of claim 5, wherein said magnet also includes a thermal shield disposed within and spaced apart from said vacuum enclosure, wherein said superconductive coil is disposed within and spaced apart from said thermal shield of said magnet, wherein said thermal shield of said dewar is thermally connected to said thermal shield of said magnet, wherein said thermal busbar is disposed within and spaced apart from said thermally connected thermal shield of said dewar and thermal shield of said magnet, and wherein said second end of said thermal busbar is disposed within said thermal shield of said magnet.

7. The cooling system of claim 6, wherein said dewar also includes a helium reservoir disposed generally within and spaced apart from said thermal shield of said dewar, wherein said helium reservoir contains said liquid helium, wherein said second stage of said cryocooler coldhead extends into said helium reservoir, and wherein said thermal busbar is hermetically connected to said helium reservoir.

8. The cooling system of claim 7, wherein said helium reservoir also contains gaseous helium disposed on top of said liquid helium such that said gaseous helium generally contacts said liquid helium along an interface, and wherein said first end of said thermal busbar is disposed within said liquid helium.

9. The cooling system of claim 8, also including a re-condensing coil attached to said second stage of said cryocooler coldhead.

10. The cooling system of claim 9, wherein said re-condensing coil extends generally downward from said second stage of said cryocooler coldhead to a point which is above and proximate said interface of said gaseous helium and said liquid helium.

11. The cooling system of claim 10, wherein said vacuum jacket of said dewar is in general vacuum communication with said vacuum enclosure of said magnet.

* * * * *